(12) United States Patent
Lohokare et al.

(10) Patent No.: US 7,959,984 B2
(45) Date of Patent: Jun. 14, 2011

(54) METHODS AND ARRANGEMENT FOR THE REDUCTION OF BYPRODUCT DEPOSITION IN A PLASMA PROCESSING SYSTEM

(75) Inventors: Shrikant P. Lohokare, Fremont, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1394 days.

(21) Appl. No.: 11/022,982

(22) Filed: Dec. 22, 2004

(65) Prior Publication Data

US 2006/0130758 A1  Jun. 22, 2006

(51) Int. Cl.
 *H05H 1/24* (2006.01)
(52) U.S. Cl. .................................. 427/569; 118/723 R
(58) Field of Classification Search ................ 427/569; 174/350; 204/192.1; 118/504, 723 R
See application file for complete search history.

(56) References Cited

U.S. PATENT DOCUMENTS

| | | | |
|---|---|---|---|
| 4,594,111 A | 6/1986 | Coonan | |
| 4,610,075 A | 9/1986 | Eriksson | |
| 5,364,219 A | 11/1994 | Takahashi et al. | |
| 5,391,275 A * | 2/1995 | Mintz | 204/192.32 |
| 5,492,569 A | 2/1996 | Nakada | |
| 6,120,660 A | 9/2000 | Chu et al. | |
| 6,135,697 A | 10/2000 | Isaacs et al. | |
| 6,380,612 B1 * | 4/2002 | Jang et al. | 257/649 |
| 6,388,382 B1 * | 5/2002 | Doi et al. | 315/111.51 |
| 6,810,548 B2 | 11/2004 | Yoshioka et al. | |
| 6,841,963 B2 | 1/2005 | Song et al. | |
| 6,973,856 B2 | 12/2005 | Shibata | |
| 2001/0006870 A1 | 7/2001 | Moore | |
| 2001/0029894 A1 * | 10/2001 | DeOrnellas et al. | 118/723 R |
| 2002/0100557 A1 * | 8/2002 | Li et al. | 156/345.48 |
| 2002/0102858 A1 * | 8/2002 | Wicker et al. | 438/731 |
| 2002/0104751 A1 * | 8/2002 | Drewery et al. | 204/192.1 |
| 2002/0121291 A1 | 9/2002 | Daum et al. | |
| 2002/0142611 A1 * | 10/2002 | O'Donnell et al. | 438/710 |
| 2003/0185655 A1 | 10/2003 | Uchimaki et al. | |
| 2003/0186566 A1 | 10/2003 | Uchimacki et al. | |
| 2003/0207655 A1 | 11/2003 | Jackson | |
| 2004/0060657 A1 * | 4/2004 | Saigusa et al. | 156/345.1 |

(Continued)

FOREIGN PATENT DOCUMENTS

EP  261347  3/1988

(Continued)

OTHER PUBLICATIONS

"International Search Report", Issued in PCT Application No. PCT/US2005/45729; Mailing Date: May 28, 2008.

(Continued)

*Primary Examiner* — Timothy H Meeks
*Assistant Examiner* — Elizabeth Burkhart
(74) *Attorney, Agent, or Firm* — IP Strategy Group, P.C.

(57) ABSTRACT

In a plasma processing system, a method of reducing byproduct deposits on a set of plasma chamber surfaces of a plasma processing chamber is disclosed. The method includes providing a deposition barrier in the plasma processing chamber, the deposition barrier is configured to be disposed in a plasma generating region of the plasma processing chamber, thereby permitting at least some process byproducts produced when a plasma is struck within the plasma processing chamber to adhere to the deposition barrier and reducing the byproduct deposits on the set of plasma processing chamber surfaces.

44 Claims, 7 Drawing Sheets

U.S. PATENT DOCUMENTS

| | | | |
|---|---|---|---|
| 2004/0134518 A1 | 7/2004 | Kraus et al. | |
| 2004/0134519 A1 | 7/2004 | Kraus et al. | |
| 2005/0014380 A1* | 1/2005 | Kai et al. | 438/706 |
| 2005/0225248 A1* | 10/2005 | Fink et al. | 315/111.21 |
| 2005/0241669 A1* | 11/2005 | Wodecki | 134/1.1 |
| 2006/0218680 A1 | 9/2006 | Bailey, III | |
| 2007/0034604 A1* | 2/2007 | Vahedi et al. | 216/67 |

FOREIGN PATENT DOCUMENTS

| | | | |
|---|---|---|---|
| EP | 801413 | * | 10/1997 |
| WO | WO 03/029513 | * | 4/2003 |
| WO | WO-03/029513 | | 4/2003 |

OTHER PUBLICATIONS

"International Preliminary Report on Patentability", Issued in PCT Application No. PCT/US2005/045729; Mailing Date: Jul. 17, 2008.
"Written Opinion", Issued in PCT Application No. PCT/US05/45729; Mailing Date: May 28, 2008.
"Final Office Action", U.S. Appl. No. 11/092,848, Correspondence Date: Sep. 15, 2008.
"Non Final Office Action", U.S. Appl. No. 11/092,848, Correspondence Date: Mar. 11, 2008.
"Non Final Office Action", U.S. Appl. No. 11/092,848, Correspondence Date: Jun. 13, 2007.
"Final Office Action", U.S. Appl. No. 11/092,848, Correspondence Date: Oct. 3, 2007.
"Non Final Office Action", U.S. Appl. No. 11/092,848, Mailing Date: Feb. 25, 2009.
"Chapter 1: Introduction," Aug. 17, 2000, pp. 1-32.
"Chapter 2: The Manufacturing Process," Sep. 4, 2000, pp. 33-62.
"Chapter 3: The Devices," Sep. 6, 1999, pp. 43-97.
"Chapter 4 : The Wire," Sep. 6, 1999, pp. 103-143.
"Chapter 5: TheCMOS Inverter," Sep. 6, 1999, pp. 144-192.
Labombard et al., "Cross-field Plasma Transport and Main-chamber Recycling in Diverted Plasmas on Alcator C-Mod," 28 pages total, http://epub.iaea.org/fusion/subscribe/40/dec/ms6940LabomB/6940.html, Oct. 17, 2004.
Carter, William P.L., "Research Plan for Next Generation Environmental Chamber Facility for Chemical Mechanism and VOC Reactivity Evaluation," pp. 1-19.
Chang et al., "Plasma-surface Interactions," J. Vac. Sci. Technol. A 21(5), Sep./Oct. 2003, pp. S145-S151.
"Alternative Discharges : Fields and Waves," TimeDomain CFD Inc., 5 pages total, http://www.timedomaincvd.com/CVD-Fundamentals/plasmas/Other_plasmas.html, Oct. 17, 2004.
Rees et al., "Processing Plasmas Face a testing Time," 4 pages total.
May, Paul, "MSc Physics of Advanced Semiconductor Materials: Plasmas and Plasma Processing," 9 pages total, Oct. 25, 2004.
"Section 4: Examples of Waste Minimization/Pollution Prevention Techniques," pp. 1-26, http://www.p2pays.org/ref/02/01844/sec_4.txt, Oct. 14, 2004.
Friz et al., "Coating Materials," pp. 105-130.
Harpold et al., "How Advanced Energy, MDX™ Products Manage Arcs," Advanced Energy, pp. 1-8.
"Reducing PFC gas emissions from CVD chamber cleaning," Solid State Technology, Dec. 2000 edition, 6 pages total.
"The self clean chemistry concept (I)" no author, no date, 1 page total.
Chu et al. "Third-generation plasma immersion ion implanter for biomedical materials and research," Review of Scientific Instruments, vol. 72, No. 3, Mar. 2001, pp. 1660-1665.
Yeoh et al., "Photoresist Strip on Orion 2.2TM in Via First Dual Damascene Cu Structures," 3 pages total.

Chu, Paul, "Chapter 10: Metallization," City University of Hong Kong, 51 total pages.
"Chapter 3: Epitaxy," City University of Hong Kong, pp. 1-24.
Yang, Yao-Joe, "Thin Film Process," 11 pages total, 21 slides.
"Chapter 9: Trench Filling by Physical Vapor Deposition," pp. 138-173.
Sobolewski et al., "Electrical Optimization of Plasma-enhanced Chemical Vapor Deposition Chamber Cleaning Plasmas," J. Vac. Sci. Technol. B 16(1), Jan./Feb. 1998, pp. 173-182.
Montgomery, Steven, "Higher Profits from Intelligent Semiconductor Equipment Maintenance: 'The Source of the Maintenance Problem,'" Future Fab International, Issue 17, 9 pages total, http://www.future-fab.com/documents.asp?d_ID=1226, Jul. 1, 2000.
Rossnagel, S.M., "Sputter deposition for semiconductor manufacturing," IBM Journal of Research and Development, vol. 43, ½, 1999, pp. 1-14, http://www.research.ibm.com/journal/rd/431/rossnagel.html.
Nickerson et al., "Plasma Cleaning of Medical Devices," Jun. 2000, 4 total pages.
Dobkin, Daniel M., "Plasmas and Deposition," 4 pages total, http://www.batnet.com/enigmatics/semiconductor_processing/CVD_Fundamentals/plasmas/ plasma_deposition.html, Oct. 17, 2004.
"Hydrogen Peroxide ($H_2O_2$): The Amazing Secrets That They Don't Want You to Know!," 6 pages total, http://www.h2o2-4u.com/, Aug. 13, 2003.
Horiuchi et al., "In-Situ Chamber Wall Cleaning in Processing Plasmas,"4 pages total.
"Evaporation," 7 pages total, 26 slides, Sep. 21, 2001.
Nelson et al., "Yttrium Oxide Nanoparticles Prepared by Alkalide Reduction," Chem. Mater., vol. 14, No. 2, 2002, pp. 915-917.
Siegerman, Howard, "Applying process-specific approaches to performing tool preventive maintenance," http://www.micromagazine.com/archive/01/10/tool.html, 9 pp., Jan. 16, 2005.
"Robotic Assembly for the 21st Century," Automation Technologies Council, 16 pp.
Derby et al., "A High Precision Robotic Docking End Effector: The Dockbot," Distributed Robotics LLC, 4 pp.
"Introduction to Industrial Robots," Warwick Manufacturing Group, 1993, 10 pp.
"Characteristics Arm—TX Series 40 Family," 2004 Staubli Faverges, pp. 1-34.
"Module 3 Robotics Technology," NSF/USF Stars, 7 pp.
"Robot Navigation Technology," Helpmate Robotics, Inc., 4 pp.
Barnes, Nick, "Docking," http://homepages.inf.ed.ac.uk/rbf/CVonline/Local_Copies/Barnes, 6 pp., Jan. 17, 2005.
U.S. Appl. No. 11/092,848; File date: Mar. 28, 2005.
"International Search Report", mailed Sep. 13, 2007, for Intl App No. PCT/US 06/10577; Filed on Mar. 24, 2006; Applicant: Lam Research Corp.
"Written Opinion", mailed Sep. 13, 2007, for Intl App No. PCT/US 06/10577; Filed on Mar. 24, 2006; Applicant: Lam Research Corp.
"International Preliminary Report on Patentability", mailed Oct. 18, 2007, for Intl App No. PCT/US 06/10577; Filed on Mar. 24, 2006; Applicant: Lam Research Corp.
"Final Office Action", U.S. Appl. No. 11/092,848, Correspondence Date: Jul. 31, 2009.
"First Office Action", CN Application No. 200680010522.3, Mailing Date Sep. 4, 2009.
"Second Office Action", CN Application No. 200680010522.3, Mailing Date Jul. 29, 2010.
"First Office Action", CN Application No. 200580047522.7, Mailing Date Jun. 1, 2010.

* cited by examiner

METHODS AND ARRANGEMENT FOR THE REDUCTION OF BYPRODUCT DEPOSITION IN A PLASMA PROCESSING SYSTEM

BACKGROUND OF THE INVENTION

The present invention relates in general to substrate manufacturing technologies and in particular to methods and arrangement for the reduction of byproduct deposition in a plasma processing system.

In the processing of a substrate, e.g., a semiconductor wafer or a glass panel such as one used in flat panel display manufacturing, plasma is often employed. As part of the processing of a substrate (chemical vapor deposition, plasma enhanced chemical vapor deposition, physical vapor deposition, etc.) for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

Many plasma processes include some type of plasma bombardment. For example, pure ion etching, often called sputtering, is used to dislodge material from the substrate (e.g., oxide, etc.). Commonly an inert gas, such as Argon, is ionized in a plasma and subsequently accelerate toward a negatively charged substrate. Likewise, reactive ion etch (RIE), also called ion-enhanced etching, combines both chemical and ion processes in order to remove material from the substrate (e.g., photoresist, BARC, TiN, Oxide, etc.). Generally ions in the plasma enhance a chemical process by striking the surface of the substrate, and subsequently breaking the chemical bonds of the atoms on the surface in order to make them more susceptible to reacting with the molecules of the chemical process.

However, a plasma processing system may also produce pollutants. Generally comprised of organic and inorganic byproducts, pollutants are generated by the plasma process from materials in the etchant gases (e.g., carbon, fluorine, hydrogen, nitrogen, oxygen, argon, xenon, silicon, boron, chlorine, etc.), from materials in the substrate (e.g. photoresist, silicon, oxygen, nitrogen, aluminum, titanium, etc.), or from structural materials within the plasma processing chamber itself (e.g., aluminum, quartz, etc.).

Some pollutants are volatile, and may be substantially pumped away by a vacuum system, while other pollutants form non-volatile or low-volatile sputtered species that tend to be deposited on interior surfaces and plasma chamber walls that tend to be difficult to efficiently evacuate from the plasma chamber. The resulting pollutant deposits may eventually flake and hence increase susceptibility of substrate defects, reduce the mean time between cleaning (MTBC), reduce yield, etc. For example, depending on the plasma process, conductive film deposits may form on plasma chamber interior surfaces which may impact the FW coupling of the plasma source and bias. In addition, byproduct deposits may contribute to plasma density drift.

Non-volatile and low-volatile byproducts include direct line-of-sight deposition of sputtered material, direct ion enhance etch byproduct deposition, volatile byproduct condensation, high sticking coefficient plasma dissociated byproducts, ion assisted deposition of plasma species, etc. Examples include high-k dielectrics (HfOx, HfSixOy, etc) byproducts, metal electrode (Pt, Ir, IrOx, etc.) byproducts, memory material byproducts (PtMn, NiFe, CoFe, FeW, etc), interconnect byproducts (Cu, Ru, CoWP, Ta, etc.).

In general, the emission profile for the sputtered atoms is generally characterized by a cosine distribution. This means that the emission rate at some angle other than normal (perpendicular) is equal to the normal incidence emission rate times the cosine of the angle from the normal. This is usually drawn as a circle touching the impact point, in which the circle is the envelope of the magnitudes of the emission at other angles. Generally, since sputtered atoms tend to be neutral, it is not possible to redirect their trajectories in flight, and hence the sputtered atoms tend to travel in straight lines.

The degree of deposit adhesion to surfaces within the chamber, and hence the subsequent degree of potential contamination, is usually dependent on the specific plasma processing recipe (e.g., chemistry, power, and temperature) and the initial surface condition of chamber process kits. Since substantially removing deposits may be time consuming, a plasma processing system chamber is generally substantially cleaned only when particle contamination levels reach unacceptable levels, when the plasma processing system must be opened to replace a consumable structure (e.g., edge ring, etc.), or as part of scheduled preventive maintenance (PM).

Figure 1:
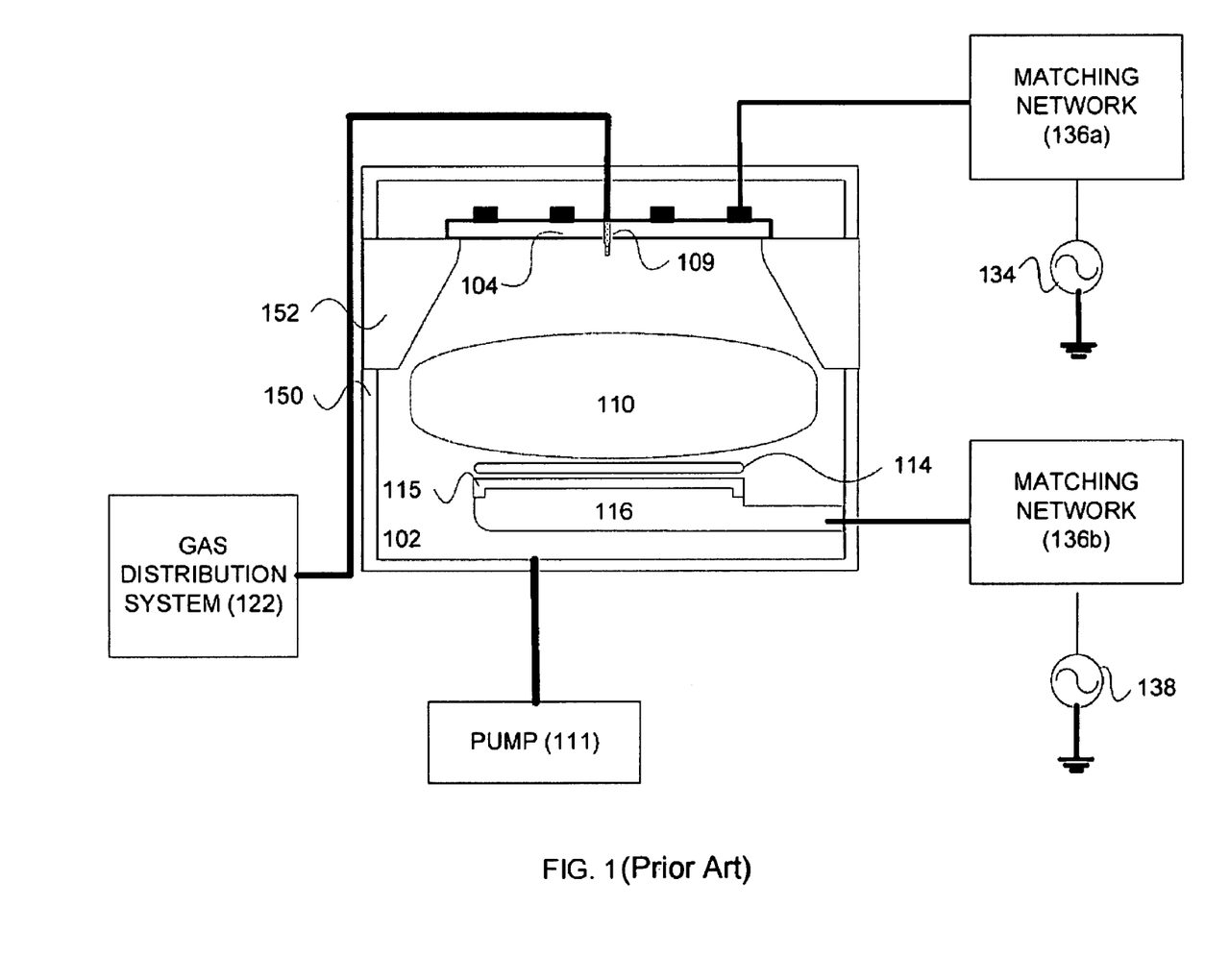
FIG. 1 shows a simplified diagram of a inductively coupled plasma processing system, such as a Lam Transformer Coupled Plasma Processing System.

Referring now to FIG. 1, a simplified diagram of an inductively coupled plasma processing system, such as a Lam Research Transformer Coupled Plasma Processing System™, is shown. In a common configuration, the plasma chamber is comprised of a bottom piece 150 located in the lower chamber, and a detachable top piece 152 located in the upper chamber. Generally, an appropriate set of gases is flowed into chamber 102 from gas distribution system 122 and through dielectric coupling window 104. These plasma processing gases may be subsequently ionized at injector 108 to form a plasma 110 in a plasma generating region, in order to process (e.g., etch or deposition) exposed areas of substrate 114, such as a semiconductor substrate or a glass pane, positioned with edge ring 115 on an electrostatic chuck 116.

A first RF generator 134 generates the plasma as well as controls the plasma density, while a second RF generator 138 generates bias RF, commonly used to control the DC bias and the ion bombardment energy. Further coupled to source RF generator 134 is matching network 136a, and to bias RF generator 138 is matching network 136b, that attempt to match the impedances of the RF power sources to that of plasma 110. Furthermore, pump 111 is commonly used to evacuate the ambient atmosphere from plasma chamber 102 in order to achieve the required pressure to sustain plasma 110.

While these are severe issues to tackle requiring complicated high temperature chamber designs, special materials etc, there is no commonality to the behavior of these different materials. For example, if plasma process conditions allow it, a clean or a self-cleaning plasma recipe can be developed, or the chamber surfaces can be designed with materials that have a reduced sticking coefficient to the problem byproduct, or if the byproducts are sufficiently adhered or "stuck" to the chamber surfaces, the plasma process can be run until flaking becomes problematic. However, since these solutions are very process sensitive, the possibility of a single robust reactor design and process approach which can handle most of these materials and potential chemistries is problematic.

In view of the foregoing, there are desired methods and arrangement for the reduction of byproduct deposition in a plasma processing system.

SUMMARY OF THE INVENTION

The invention relates, in one embodiment, in a plasma processing system, a method of reducing byproduct deposits on a set of plasma chamber surfaces of a plasma processing chamber. The method includes providing a deposition barrier in the plasma processing chamber, the deposition barrier is configured to be disposed in a plasma generating region of the plasma processing chamber, thereby permitting at least some process byproducts produced when a plasma is struck within the plasma processing chamber to adhere to the deposition barrier and reducing the byproduct deposits on the set of plasma processing chamber surfaces.

The invention relates, in another embodiment, to a method of reducing a set of byproduct deposits on a set of plasma chamber surfaces in a plasma reactor. The method includes positioning a substrate in a plasma processing chamber. The method further includes positioning a deposition barrier in the plasma processing chamber, wherein a first plasma is configured to surround the deposition barrier when struck, and whereby the deposition barrier is configured to make contact with a first subset of the set of byproduct deposits from the substrate. The method also includes re-positioning the deposition barrier in the plasma processing chamber, wherein a second plasma is configured to surround the deposition barrier when struck, and whereby the deposition barrier is configured to make contact with a second subset of the set of byproduct deposits from the substrate.

The invention relates, in another embodiment, in a plasma processing system, to an arrangement for reducing byproduct deposits on a set of plasma chamber surfaces of a plasma processing chamber. The arrangement includes barrier means disposed in the plasma processing chamber, the barrier means being configured to be disposed in a plasma generating region of the plasma processing chamber, thereby permitting at least some process byproducts produced when a plasma is struck within the plasma processing chamber to adhere to the deposition barrier and reducing the byproduct deposits on the set of plasma processing chamber surfaces. The arrangement also includes attachment means for attaching the barrier means to one of a top, bottom, and side of an interior of the plasma processing chamber.

The invention relates, in another embodiment, to a deposition barrier arrangement configured to reduce byproduct deposits on a set of plasma chamber surfaces of a plasma processing chamber. The arrangement includes a deposition barrier configured to be disposed in a plasma generating region of the plasma processing chamber, the deposition barrier being configured to enable at least some process byproducts produced when a plasma is struck within the plasma processing chamber to adhere to the deposition barrier and thereby reducing the byproduct deposits on the set of plasma chamber surfaces.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that sputtering deposition can be reduced on a set of plasma chamber surfaces through the use of a deposition barrier that is substantially surrounded by a plasma. That is, a deposition barrier may be positioned such that if a particle is sputtered from the substrate toward a plasma chamber surface, the particle will first strike the deposition barrier.

In a non-obvious fashion, sputtered atoms that would normally collide with other surfaces in the chamber, as well as the pumping manifold including the turbo pump, can be intercepted with a deposition barrier that is substantially easy to remove. For example, the deposition barrier may be automatically transferred in and out of the plasma chamber to an ex-situ cleaning process. In one embodiment, the deposition barrier can also protect the electrostatic chuck during waferless auto clean WAC™ (or wafer less chamber conditioning), in which plasma chamber components are exposed to the plasma as part of the cleaning or conditioning/seasoning process.

Figure 2:
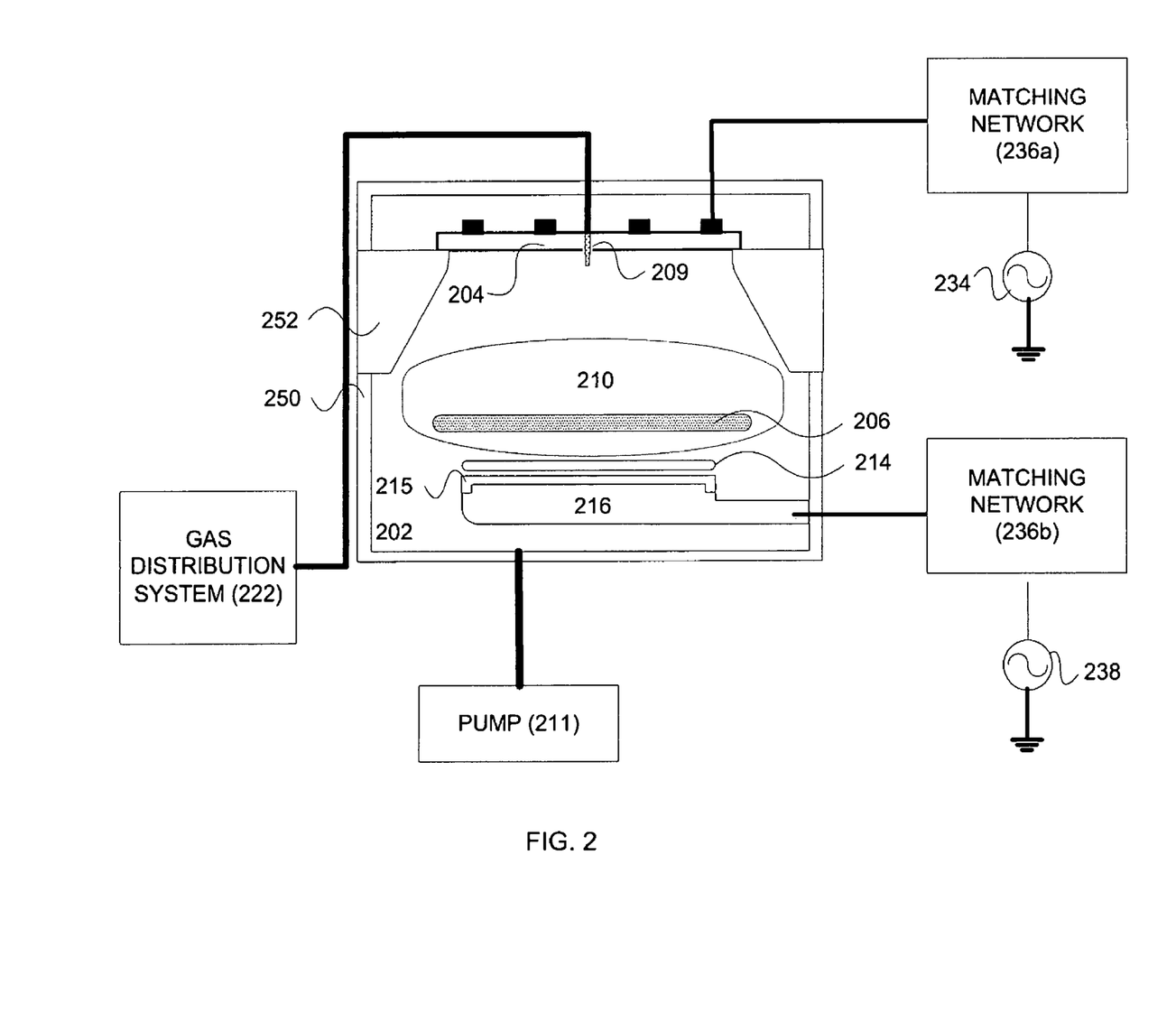
FIG. 2 shows a simplified diagram of a inductively coupled plasma processing system with a deposition barrier, according to one embodiment of the invention.

Referring now to FIG. 2, a simplified diagram of an inductive coupled plasma processing system is shown, according to one embodiment of the invention. In a common configuration, the plasma chamber is comprised of a bottom piece 250 located in the lower chamber, and a detachable top piece 252 located in the upper chamber. Generally, an appropriate set of gases is flowed into chamber 202 from gas distribution system 222 and through dielectric coupling window 204. These plasma processing gases may be subsequently ionized at injector 209 to form a plasma 210, in order to process (e.g., etch or deposition) exposed areas of substrate 214, such as a semiconductor substrate or a glass pane, positioned with edge ring 215 on an electrostatic chuck 216.

A first RF generator 234 generates the plasma as well as controls the plasma density, while a second RF generator 238 generates bias RF, commonly used to control the DC bias and the ion bombardment energy. Further coupled to source RF generator 234 is matching network 236a, and to bias RF generator 238 is matching network 236b, that attempt to match the impedances of the RF power sources to that of plasma 210. Furthermore, pump 211 is commonly used to evacuate the ambient atmosphere from plasma chamber 202 in order to achieve the required pressure to sustain plasma 220.

In addition, a deposition barrier 206 is positioned at a height above the bottom surface of said plasma reactor, such that if a particle is sputtered from the substrate toward a plasma chamber wall, the particle will first strike the deposition barrier.

Figure 3:
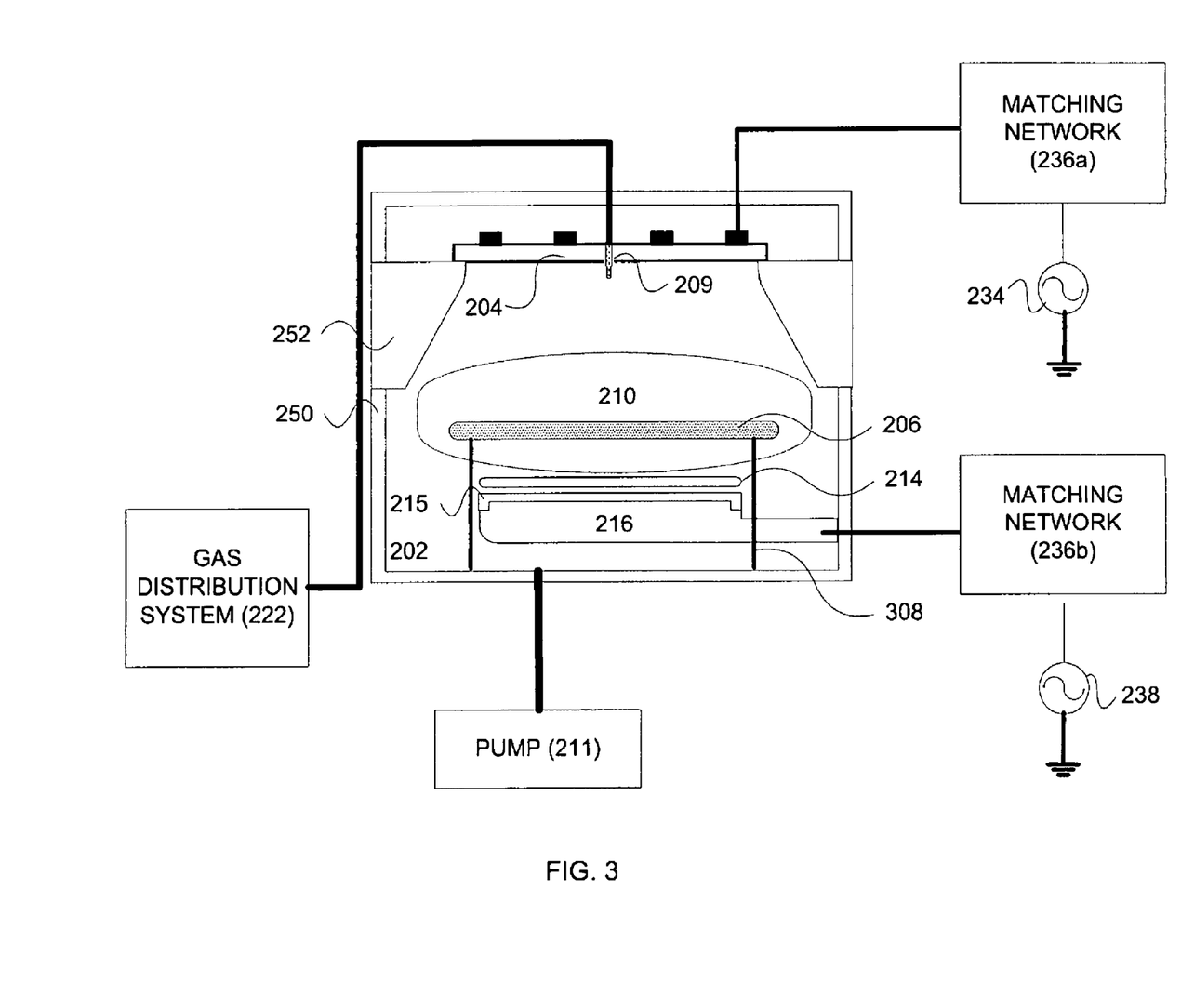
FIG. 3 shows a simplified diagram of a inductively coupled plasma processing system in which a deposition barrier is supported with a structure that is attached to the bottom of the plasma chamber, according to one embodiment of the invention.

Referring now to FIG. 3, the simplified diagram of a inductive coupled plasma processing system of FIG. 2 is shown, in which a deposition barrier is supported with a structure 308 that is attached to the bottom of the plasma chamber (lower interior surface), according to one embodiment of the invention.

Figure 4:
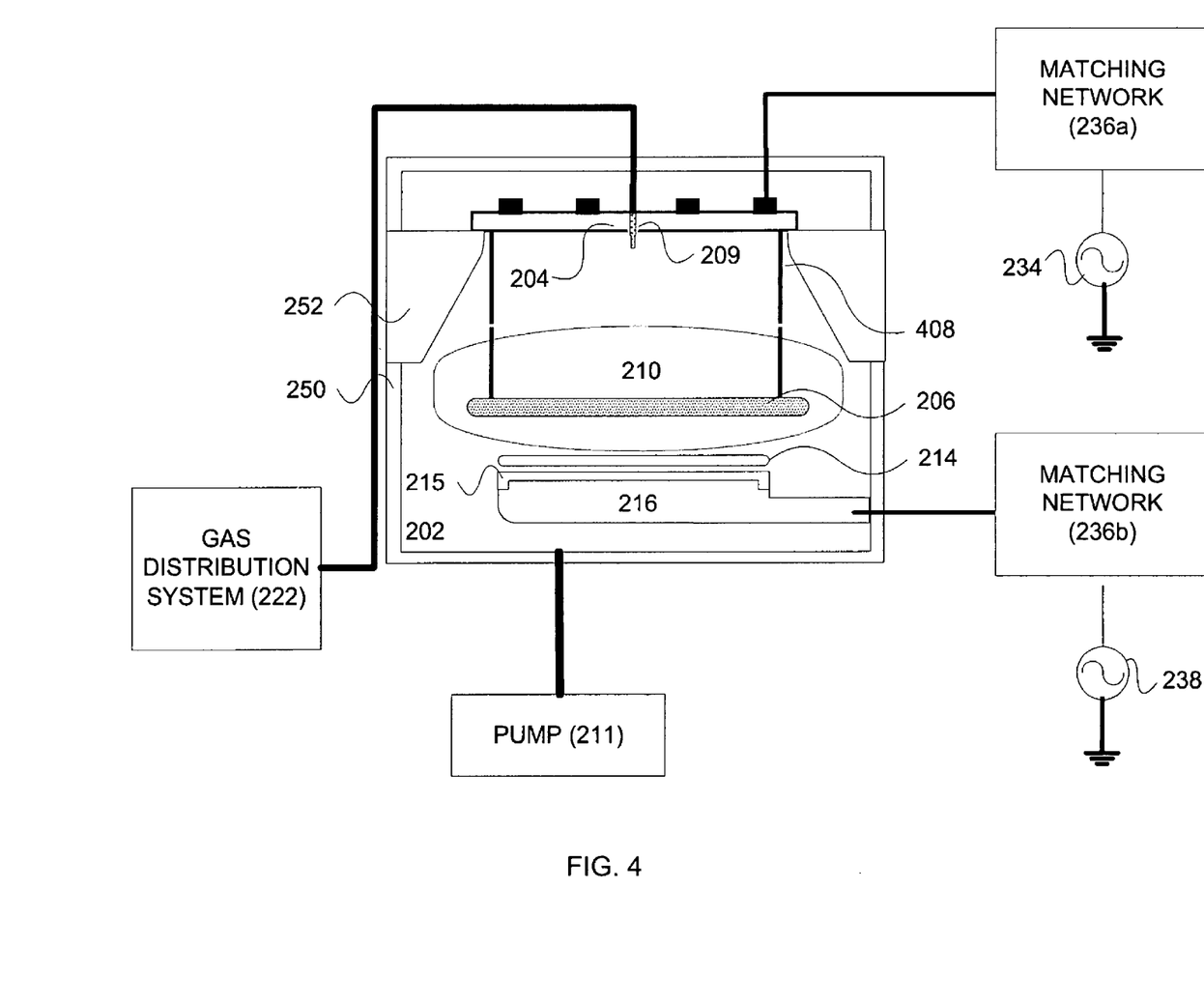
FIG. 4 shows a simplified diagram of a inductively coupled plasma processing system in which a deposition barrier is supported with a structure that is attached to the top of the plasma chamber, according to one embodiment of the invention.

Referring now to FIG. 4, the simplified diagram of a inductive coupled plasma processing system of FIG. 2 is shown, in which a deposition barrier is supported with a structure 408 that is attached to the top of the plasma chamber (upper interior surface), according to one embodiment of the invention.

Figure 5:
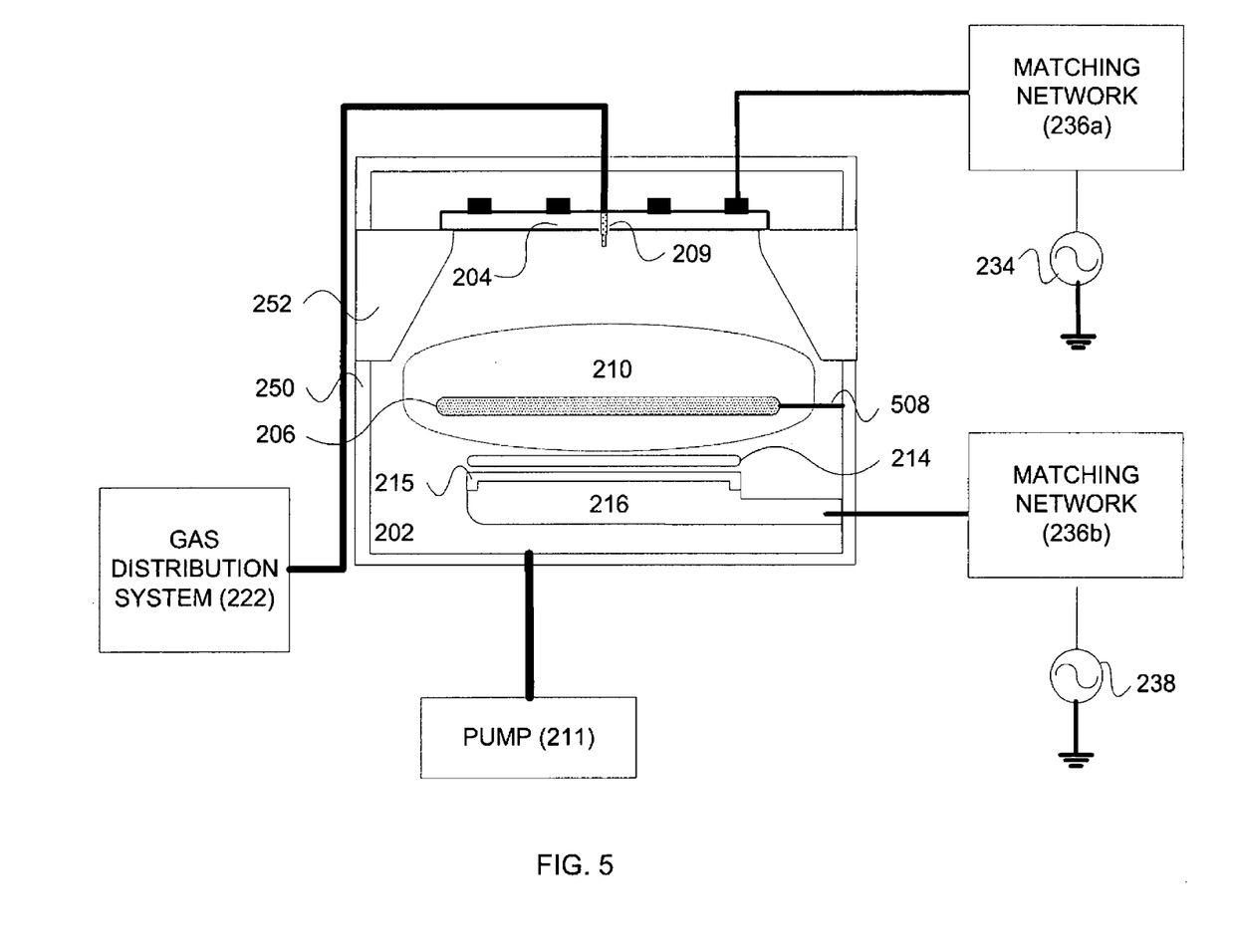
FIG. 5 shows a simplified diagram of a inductively coupled plasma processing system in which a deposition barrier is supported with a structure that is attached to a side of the plasma chamber, according to one embodiment of the invention.

Referring now to FIG. 5 the simplified diagram of a inductive coupled plasma processing system of FIG. 2 is shown, in which a deposition barrier is supported with a structure 508 that is attached to a side of the plasma chamber (side interior surface), according to one embodiment of the invention.

Figure 6:
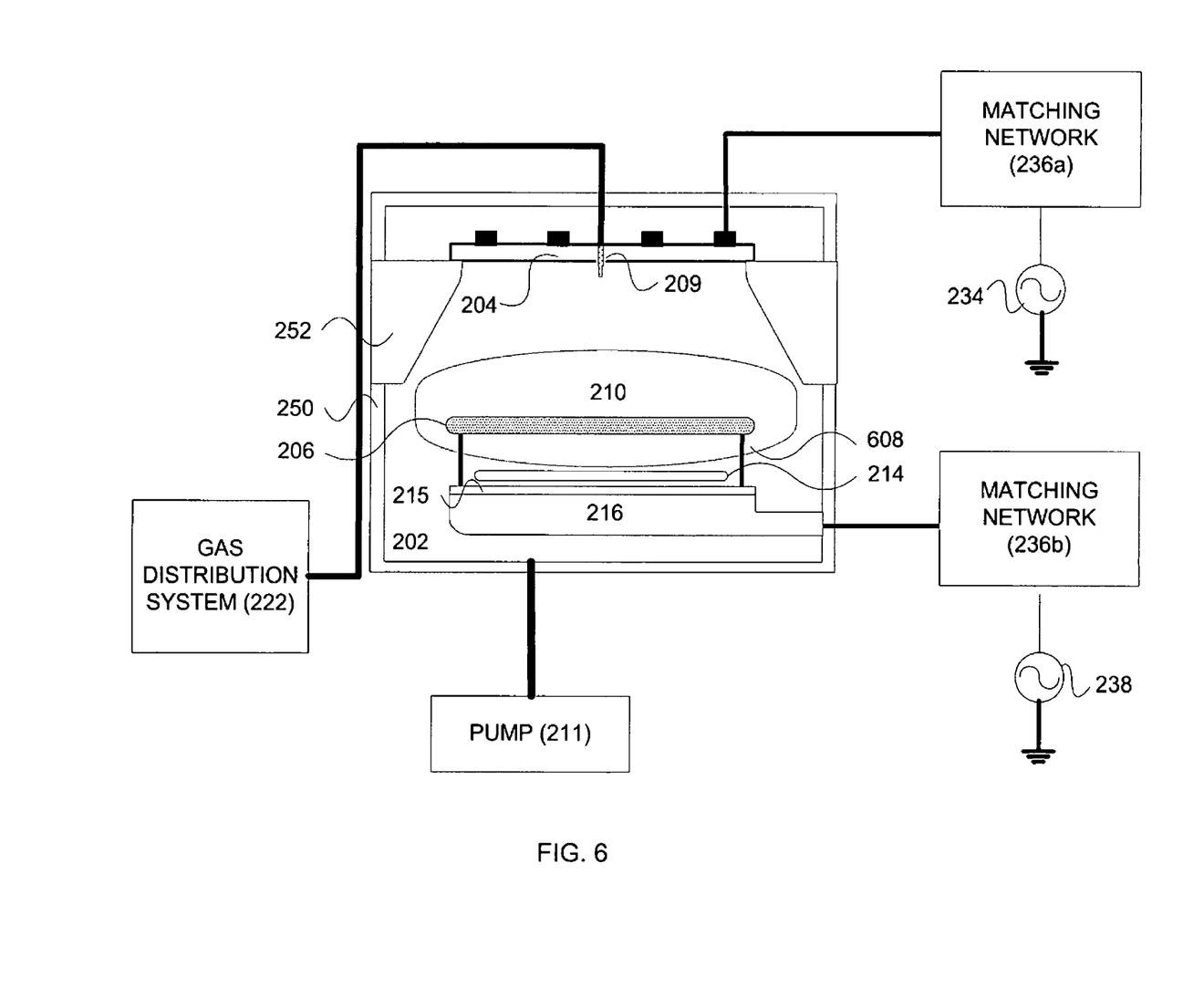
FIG. 6 shows a simplified diagram of a inductively coupled plasma processing system in which a deposition barrier is supported with a structure that is attached to a chuck, according to one embodiment of the invention; and, FIG. 7 shows a simplified diagram of a method for the reduction of low volatility line-of-sight byproducts in a plasma processing system, according to one embodiment of the invention.

Referring now to FIG. 6 the simplified diagram of an inductive coupled plasma processing system of FIG. 2 is shown, in which a deposition barrier is supported with a structure 608 that is attached to chuck 216, according to one embodiment of the invention.

In one embodiment, the height of the bottom surface of the deposition barrier can be repositioned relative to the bottom surface of said plasma reactor, in order to better optimize plasma processing conditions. In another embodiment, the deposition barrier is substantially transparent to a generated RF. In yet another embodiment, the deposition barrier comprises a material that is substantially resistant to plasma attack (i.e., quartz, $Y_2O_3$, yttrium, $CeO_2$, cerium, $ZrO_2$, zirconium, polytetrafluoroethylene—PTFE, such as TEFLON® available from DuPont, www.dupont.com, polyimide-based polymer—such as VESPEL® also available from DuPont, substantially pure plastic, ceramic, SiC, BN, BC, SiN, SiO, etc.). In yet another embodiment, the deposition barrier comprises a material that generates a set volatile etch products when exposed to said plasma.

In another embodiment, the deposition barrier is heated independently of the plasma. In yet another embodiment, a RF bias is applied to the deposition barrier. In yet another embodiment, deposition barrier can be removed in-situ, for example by a robotic arm. In yet another embodiment, deposition barrier can be replaced in-situ, for example by a robotic arm. In another embodiment, the deposition barrier may be removed from the plasma processing system by a vacuum robot under automatic control.

In yet another embodiment, deposition barrier includes a substantially continuous surface. In yet another embodiment, deposition barrier includes a set of holes. In yet another embodiment, deposition barrier can be removed prior to, simultaneously with, or after the removal of said substrate from said plasma chamber. In yet another embodiment, deposition barrier is a Faraday barrier.

In another embodiment, the deposition barrier can be cleaned and reused. In yet another embodiment, plasma processing system includes a source RF that is coupled from the top, side, or bottom of the plasma chamber. In yet another embodiment, a set of plasma chamber walls can be heated and/or cooled independently of the plasma.

In another embodiment, the deposition barrier may be heated to encourage adhesion of thicker films and to prevent incorporation of volatile species which may lead to premature flaking. In yet another embodiment, the deposition barrier may be cooled to increase the sticking probability of substantially volatile deposition by products and to enable thicker films before flaking. In yet another embodiment, the deposition barrier may be cleaned in-situ by a plasma cleaning process when the deposition barrier has cooled down from being hot. In yet another embodiment, the deposition barrier is cleaned in-situ by a plasma cleaning process when the deposition barrier has heated up from being cool.

In another embodiment, the deposition barrier is comprised of a metal that does not substantially generate a set of volatile etch products when exposed to the plasma (e.g. Ni, Pt, Ir, anodized Al, Cu, etc.).

In another embodiment, the deposition barrier may be cleaned in-situ by a plasma cleaning process. In yet another embodiment, the deposition barrier may be cleaned in-situ by a wet chemical flush process. In yet another embodiment, the deposition barrier comprises a material that is substantially resistant to a wet clean process. In yet another embodiment, the deposition barrier is coated by a material that is substantially resistant to a wet clean process. In another embodiment, the deposition barrier may be lowered onto the chuck, in order to protect the chuck, while running an in-situ plasma chamber clean. In another embodiment, the deposition barrier may be lowered onto the chuck, in order to protect the chuck, while the chamber is idle between substrate processing cycles.

In another embodiment the deposition barrier may protect a source RF. In yet another embodiment, the source RF comprises an inductive source. In yet another embodiment, the source RF comprises a capacitive source. In yet another embodiment the source RF comprises an ECR (electron-cyclotron resonance) source. In yet another embodiment, the source RF comprises a microwave source. In yet another embodiment, the source RF may be coupled from the top of the plasma chamber. In yet another embodiment, the source RF may be coupled from the side of the plasma chamber. In yet another embodiment, the source RF may be coupled from the bottom of the plasma chamber.

In another embodiment, the deposition barrier may protect a set of plasma gas injectors from erosion and deposition clogging. In another embodiment, the deposition barrier may protect a set of in-situ metrology sensors (such as optical emission, interferometry, etc.) or the transparent windows covering them from erosion and deposition clogging. In yet another embodiment, the deposition barrier surface has a pre-determined roughness which facilitates control of adhesion of the depositing material. In another embodiment, the deposition barrier surface has a pre-determined surface composition which facilitates control of adhesion of the depositing material.

Figure 7:
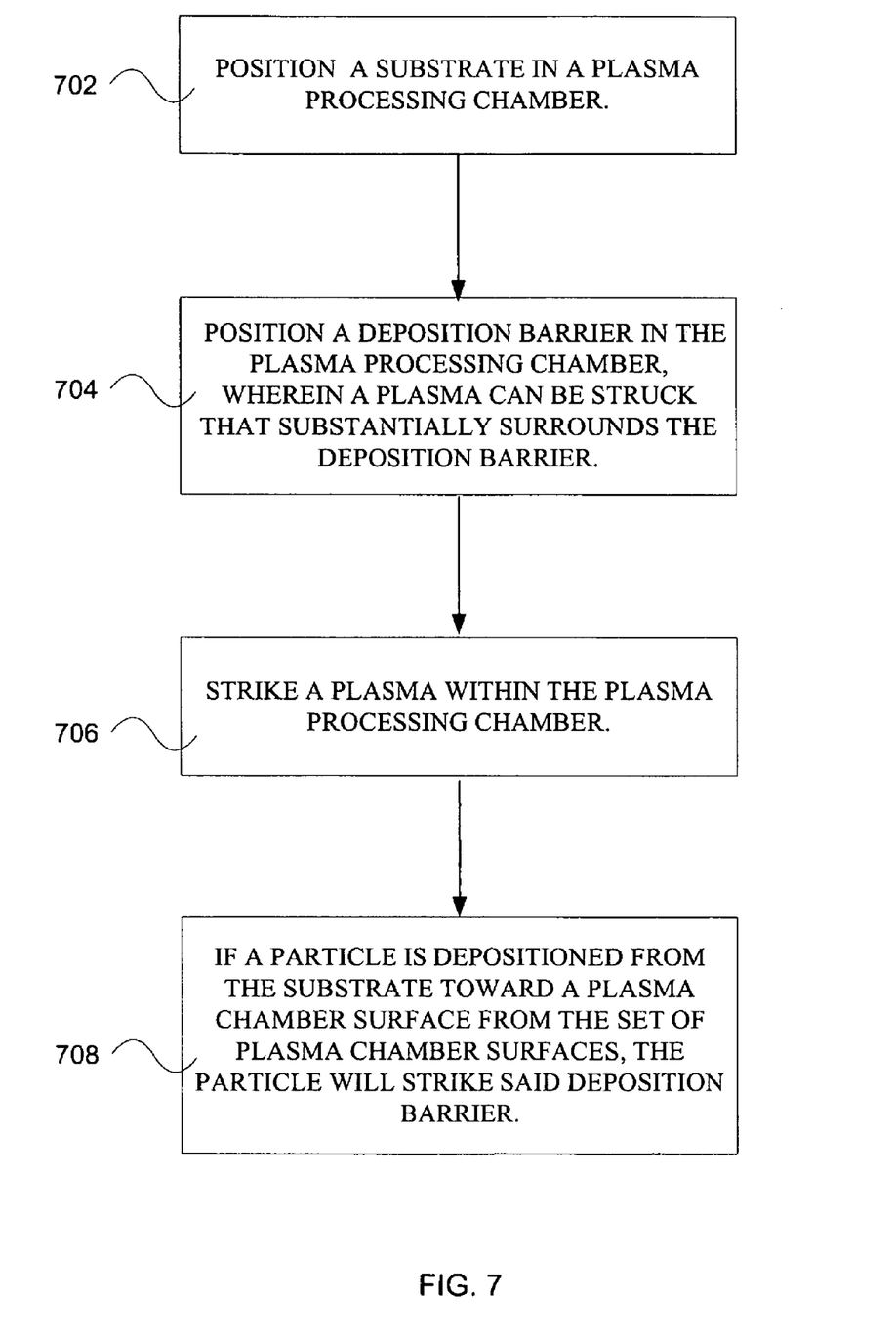

Referring now to FIG. 7, a simplified method for the reduction of low volatility products in a plasma processing system is shown, according to one embodiment of the invention. Initially, a substrate is positioned in a plasma processing chamber at step 702. Next a deposition barrier is positioned in the plasma processing chamber, wherein a plasma can be struck that substantially surrounds the deposition barrier, at step 704. A plasma is then struck within the plasma processing chamber, at step 706. If a particle is sputtered from the substrate toward a plasma chamber surface from the set of plasma chamber surfaces, the particle will strike said deposition barrier, as step 708.

The invention has been described in terms of several preferred embodiments, there are alterations, permutations, and equivalents which fall within the scope of this invention. For example, although the present invention has been described in connection with a Lam Research Transformer Coupled Plasma Processing System™, other plasma processing systems may be used (e.g., etching, deposition, ion sputter, electron beam, cluster ion beam. etc.) It should also be noted that there are many alternative ways of implementing the methods of the present invention.

Advantages of the invention include methods and arrangement for the reduction of byproduct deposition in a plasma processing system. Additional advantages include substantially improving productivity and device yield, the use of a common plasma chamber design across multiple plasma processing applications (i.e., FeRAM, MRAM, Cu, MEMS, metal gate high-k gate, etc.), process repeatability, low CoC, low COO, high MTBC, low MTTCR, and the extended lifetime of plasma chamber parts.

Having disclosed exemplary embodiments and the best mode, modifications and variations may be made to the disclosed embodiments while remaining within the subject and spirit of the invention as defined by the following claims.

What is claimed is:

1. A method for reducing byproduct deposits on a set of plasma chamber surfaces of a plasma processing chamber in a plasma processing system for processing at least a substrate, said byproduct deposits being produced from said substrate, the method comprising:
   providing a deposition barrier in said plasma processing chamber, said deposition barrier is configured to be disposed in a plasma generating region of said plasma processing chamber, thereby permitting at least some process byproducts produced when a plasma is struck within said plasma processing chamber to adhere to said deposition barrier and reducing said byproduct deposits on said set of plasma processing chamber surfaces;
   providing a structure inside said plasma processing chamber and under said deposition barrier;
   supporting said deposition barrier using said structure, said structure being attached to a bottom of said plasma processing chamber, said structure enabling said deposition barrier to be repositioned relative to said bottom of said plasma processing chamber;
   positioning said deposition barrier at a first position inside said plasma processing chamber relative to said bottom of said plasma processing chamber;
   striking a first plasma in said plasma processing chamber when said deposition barrier is at said first position;
   using said deposition barrier to contact a first subset of said byproduct deposits when said deposit barrier is at said first position;
   re-positioning said deposition barrier to a second position inside said plasma processing chamber relative to said bottom of said plasma processing chamber;
   striking a second plasma in said plasma processing chamber when said deposition barrier is at said second position;
   using said deposition barrier to contact a second subset of said byproduct deposits when said deposition barrier is at said second position; and
   including a resistant material in said deposition barrier, said resistant material being resistant to attack of said plasma.

2. The method of claim 1 wherein said deposition barrier is a Faraday shield.

3. The method of claim 1 further comprising:
   cooling said deposition barrier; and
   after said cooling, cleaning said deposition barrier in-situ using a plasma cleaning process.

4. The method of claim 1 wherein said deposition barrier is coated by said resistant material.

5. The method of claim 1, wherein said deposition barrier comprises at least one of polytetrafluoroethylene, BN, BC, SiN, SiO, SiC, and plastic.

6. The method of claim 1 further comprising:
   lowering said deposition barrier onto a chuck for protecting said chuck, said chuck being disposed inside said plasma processing chamber for supporting said substrate during processing of said substrate; and
   after said lowering, cleaning said plasma processing chamber when said chuck is protected by said deposition barrier.

7. The method of claim 1, further comprising independently heating said deposition barrier irrespective of said first plasma and said second plasma.

8. The method of claim 1, further comprising applying a RF bias to said deposition barrier.

9. The method of claim 1 wherein said deposition barrier comprises a metal that does not generate a substantial quantity of volatile etch byproducts when exposed to said plasma.

10. The method of claim 9 further comprising simultaneously removing both said substrate and said deposition barrier from said plasma processing chamber.

11. The method of claim 1 further comprising;
   heating said deposition barrier; and
   after said heating, cleaning said deposition barrier in-situ using a plasma cleaning process.

12. The method of claim 1 further comprising performing ex-situ cleaning of said deposition barrier using a wet chemical flush process.

13. The method of claim 12, wherein said deposition barrier comprises a material that is substantially resistant to a wet clean process.

14. The method of claim 12, wherein said deposition barrier is coated by a material that is substantially resistant to a wet clean process.

15. The method of claim 1, wherein said deposition barrier can be removed while substantially maintaining a vacuum in the plasma chamber.

16. The method of claim 15, wherein said removal can be accomplished by a vacuum robot under automatic control.

17. The method of claim 1, wherein said deposition barrier can be replaced in-situ.

18. The method of claim 1, wherein said deposition barrier includes a substantially continuous surface.

19. The method of claim 1, wherein said deposition barrier includes a set of holes.

20. The method of claim 1, further comprising removing said deposition barrier prior to removing said substrate from said plasma processing chamber.

21. The method of claim 1, further comprising removing said deposition barrier after removing said substrate from said plasma processing chamber.

22. The method of claim 1, further comprising:
performing a first substrate processing cycle using said plasma processing chamber; and
after said performing said first substrate processing cycle and before performing a second substrate processing cycle using said plasma processing chamber, lowering said deposition barrier onto a chuck for protecting said chuck, said chuck being disposed inside said plasma processing chamber for supporting said substrate.

23. The method of claim 1, further comprising including a material in said deposition barrier for generating a set of volatile etch products, said set of volatile etch products being generated when said deposition barrier is exposed to said plasma.

24. The method of claim 1, wherein said deposition barrier protects a source RF.

25. The method of claim 24 wherein said source RF comprises an inductive source.

26. The method of claim 25 wherein said source RF is configured to protect a dielectric coupling window for said inductive source.

27. The method of claim 24 wherein said source RF comprises a capacitive source.

28. The method of claim 24 wherein said source RF comprises an inductive source and a capacitive source.

29. The method of claim 24 wherein said source RF comprises ECR source.

30. The method of claim 24 wherein said source RF comprises a microwave source.

31. The method of claim 1, wherein said plasma processing system includes a source RF that is coupled from a top of said plasma processing chamber.

32. The method of claim 1, wherein said plasma processing system includes a source RF that is coupled from a side of said plasma processing chamber.

33. The method of claim 1, wherein said plasma processing system includes a source RF that is coupled from a bottom of said plasma processing chamber.

34. The method of claim 1, wherein said set of plasma chamber surfaces is configured to be independently heated.

35. The method of claim 1, wherein said set of plasma chamber surfaces is configured to be independently cooled.

36. The method of claim 1 further comprising: independently heating a set of plasma chamber walls of said plasma processing chamber irrespective of said first plasma and said second plasma.

37. The method of claim 1 further comprising independently cooling said deposition barrier irrespective of said first plasma and said second plasma.

38. The method of claim 1 further comprising:
halting processing of substrates in said plasma processing chamber at least until said deposition barrier is cooled down to a predefined temperature threshold; and
cleaning said deposition barrier in-situ after said deposition barrier is cooled at least down to said predefined temperature threshold.

39. The method of claim 1 wherein said deposition barrier is cleaned in-situ by a plasma cleaning process when said deposition barrier has heated up.

40. The method of 1 wherein said deposition barrier is configured to protect a set of gas injectors from said byproduct deposits 41. The method of claim 1, wherein said deposition barrier surface has a pre-determined roughness which facilitates control of adhesion of the depositing material.

42. The method of claim 1, wherein said deposition barrier surface has a pre-determined surface composition which facilitates control of adhesion of the depositing material.

43. A method of reducing a set of byproduct deposits on a set of plasma chamber surfaces in a plasma reactor, the method comprising:
positioning a substrate in a plasma processing chamber;
positioning a deposition barrier in said plasma processing chamber;
providing a structure inside said plasma processing chamber and under said deposition barrier;
supporting said deposition barrier using said structure, said structure being attached to a bottom of said plasma processing chamber, structure enabling said deposition barrier to be repositioned relative to said bottom of said plasma processing chamber;
positioning said deposition barrier at a first position inside said plasma processing chamber relative to said bottom of said plasma processing chamber;
striking a first plasma in said plasma processing chamber such that said first plasma surrounds said deposition barrier when said deposition barrier is at said first position;
using said deposition barrier to contact a first subset of said set of byproduct deposits when said deposition barrier is at said first position, said byproduct deposits being produced from said substrate;
re-positioning said deposition barrier to a second position inside said plasma processing chamber relative to said bottom of said plasma processing chamber;
striking a second plasma in said plasma processing chamber when said deposition barrier is at said second position;
using said deposition barrier to contact a second subset of said set of byproduct deposits when said deposition barrier is at said second position;
cooling said deposition barrier; and
after said cooling, cleaning said deposition barrier in-situ using a plasma cleaning process.

44. A deposition barrier arrangement configured to reduce byproduct deposits on a set of plasma chamber surfaces of a plasma processing chamber, the deposition barrier arrangement comprising:
a deposition barrier disposed in a plasma generating region of said plasma processing chamber, said deposition barrier being configured to enable at least some process byproducts produced when a plasma is struck within said plasma processing chamber to adhere to said deposition barrier and thereby reducing said byproduct deposits on said set of plasma chamber surfaces;
a structure disposed inside said plasma processing chamber and disposed under said deposition barrier, said structure supporting said deposition barrier, said structure being attached to a bottom of said plasma processing chamber, said structure being configured for repositioning said deposition barrier relative to said bottom of said plasma processing chamber,
wherein said deposition barrier comprises a material for generating a set of volatile etch products when said deposition barrier is exposed to said first plasma.

* * * * *